(12) United States Patent
Ghasr et al.

(10) Patent No.: US 10,921,264 B2
(45) Date of Patent: Feb. 16, 2021

(54) MICROWAVE REFLECTOMETRY FOR PHYSICAL INSPECTIONS

(71) Applicant: The Curators of the University of Missouri, Columbia, MO (US)

(72) Inventors: Mohammad Tayeb Ghasr, Rolla, MO (US); Reza Zoughi, Wildwood, MO (US); Satyajeet Shinde, Rolla, MO (US); Sasi Jothibasu, Rolla, MO (US)

(73) Assignee: THE CURATORS OF THE UNIVERSITY OF MISSOURI, Columbia, MO (US)

( * ) Notice: Subject to any disclaimer, the term of this patent is extended or adjusted under 35 U.S.C. 154(b) by 208 days.

(21) Appl. No.: 16/326,529

(22) PCT Filed: Aug. 18, 2017

(86) PCT No.: PCT/US2017/047489
§ 371 (c)(1),
(2) Date: Feb. 19, 2019

(87) PCT Pub. No.: WO2018/035401
PCT Pub. Date: Feb. 22, 2018

(65) Prior Publication Data
US 2019/0227003 A1    Jul. 25, 2019

Related U.S. Application Data

(60) Provisional application No. 62/377,387, filed on Aug. 19, 2016.

(51) Int. Cl.
*G01R 31/28* (2006.01)
*G01N 22/00* (2006.01)
*G07D 7/10* (2006.01)
*G07D 7/202* (2016.01)
*G07D 7/1205* (2016.01)
*G01R 27/06* (2006.01)

(52) U.S. Cl.
CPC .......... *G01N 22/00* (2013.01); *G01R 31/2879* (2013.01); *G07D 7/10* (2013.01); *G07D 7/1205* (2017.05); *G07D 7/205* (2013.01); *G01R 27/06* (2013.01); *G01R 31/2896* (2013.01)

(58) Field of Classification Search
CPC ........ G01R 31/2879; G07D 7/10; G07D 7/205
See application file for complete search history.

(56) References Cited

U.S. PATENT DOCUMENTS

| | | | |
|---|---|---|---|
| 5,757,521 A | * | 5/1998 | Walters .............. G06K 19/0672 235/380 |
| 5,936,421 A | | 8/1999 | Stowers et al. |
| 6,525,555 B1 | | 2/2003 | Khandros et al. |
| 6,876,220 B2 | | 4/2005 | Witte |
| 7,183,991 B2 | | 2/2007 | Bhattacharyya et al. |

(Continued)

*Primary Examiner* — Alvaro E Fortich
(74) *Attorney, Agent, or Firm* — Stinson LLP

(57) ABSTRACT

Utilizing microwave reflections to compare a reference device with counterfeit and/or aging devices under test. The reflection from the device under test varies based on certain properties, which results in each device having a unique and intrinsic electromagnetic signature. Comparisons of the electromagnetic signature of the device under test to the electromagnetic signature of a reference device enable evaluating the acceptability of the device under test.

20 Claims, 13 Drawing Sheets

(56) References Cited

U.S. PATENT DOCUMENTS

| | | |
|---|---|---|
| 7,190,177 B2 | 3/2007 | Zoughi et al. |
| 7,439,749 B2 | 10/2008 | Zoughi et al. |
| 7,746,266 B2 | 6/2010 | Zoughi et al. |
| 7,876,114 B2 | 1/2011 | Campbell et al. |
| 7,915,909 B2 | 3/2011 | Dunn et al. |
| 8,212,573 B2 | 7/2012 | AbouKhousa et al. |
| 8,482,602 B2 | 7/2013 | Pommerenke et al. |
| 9,046,605 B2 | 6/2015 | Ghasr et al. |
| 9,081,045 B2 | 7/2015 | Zoughi et al. |
| 9,316,734 B2 | 4/2016 | Case et al. |
| 9,482,626 B2 | 11/2016 | Ghasr et al. |
| 2003/0115008 A1 | 6/2003 | Doi |
| 2010/0117667 A1 | 5/2010 | Lo |
| 2010/0328142 A1 | 12/2010 | Zoughi et al. |
| 2012/0286797 A1 | 11/2012 | Kato et al. |
| 2012/0304756 A1 | 12/2012 | White et al. |
| 2013/0068971 A1 | 3/2013 | Shiota |
| 2014/0132297 A1 | 5/2014 | Hwang et al. |
| 2015/0067422 A1* | 3/2015 | Hamilton ................ G06F 11/24 714/724 |
| 2015/0091594 A1* | 4/2015 | Hamilton ................ G01R 1/07 324/750.01 |

\* cited by examiner (b) Ka-band

MICROWAVE REFLECTOMETRY FOR PHYSICAL INSPECTIONS

CROSS-REFERENCE TO RELATED APPLICATIONS

This application is a national stage application of PCT/US2017/047489, filed Aug. 18, 2017, which claims the benefit of U.S. Provisional Patent Application No. 62/377,387, filed Aug. 19, 2016, the contents of which are incorporated by reference in their entirety for all purposes.

BACKGROUND

Electronic devices and components that are counterfeit, tampered with, cloned, aged, and/or manufactured in a substandard manner present various significant problems and risks, such as unexpected failure, disruption in service, unreliability, unauthorized exploitation, and/or compromised safety and security. Exemplary electronic devices include integrated circuits, capacitors, resistors, and non-linear devices (e.g., detectors, fast switching PIN diodes, varactor diodes, etc.). There are many properties of a certain device that may cause it to be considered unacceptable for use in products. Moreover, properties (e.g., shape, size, electronic characteristics, etc.) vary among many types of devices. These variabilities create significant challenges to quickly and accurately determining whether a particular device is acceptable for use.

SUMMARY

Briefly, aspects of the present disclosure utilize microwave reflections to distinguish between a reference device (e.g., integrated circuit, or IC) and counterfeit and/or aging devices under test. The reflection from the device under test varies based on certain properties (e.g., internal IC package interconnect layout, bond wire routing, IC casing material, presence/absence of silicon die, etc.). These properties result in each device having a unique and intrinsic electromagnetic signature. Comparisons of the electromagnetic signature of the device under test to the electromagnetic signature of a reference device enable evaluating the acceptability of the device under test.

In an aspect, a method of evaluating a device under test (DUT) includes irradiating a DUT with a first electromagnetic signal. The first electromagnetic signal includes electromagnetic energy having a microwave or higher frequency. A second electromagnetic signal is received, which includes the electromagnetic energy of the first electromagnetic signal reflected by the DUT. A measuring device measures a reflection coefficient associated with the DUT as a function of frequency of the second electromagnetic signal. An electromagnetic signature of the DUT is determined as a function of the reflection coefficient associated with the DUT. The electromagnetic signature of the DUT is compared to one or more known electromagnetic signatures to evaluate the DUT.

In another aspect, a system for evaluating an electronic device includes a probe, a measuring instrument, and a processor. The probe is coupled to a signal source. The probe also includes a radiating aperture through which an electromagnetic signal generated by the signal source is transmitted to an electronic device located remotely from the aperture. An electromagnetic signal reflected from the electronic device is also received by the aperture. A magnitude and a phase of the reflected electromagnetic signal exhibit different characteristics from a magnitude and a phase of the transmitted electromagnetic signal. The electronic device is aligned relative to the waveguide. The measuring instrument is coupled to the probe and configured to measure a complex reflection coefficient as a function of frequency of the reflected electromagnetic signal. The reflection coefficient has a magnitude and a phase. The processor is configured to determine an electromagnetic signature of the electronic device as a function of the measured complex reflection coefficient relative to one or more known electromagnetic signatures.

In yet another aspect, a method for non-destructive detection of counterfeit electronic devices includes an antenna transmitting an electromagnetic signal that includes at least high-frequency electromagnetic energy incident upon an electronic device aligned relative to the antenna. The antenna receives an electromagnetic field reflected from the electronic device. The reflected electromagnetic field has a magnitude and a phase that differ from a magnitude and a phase of the transmitted electromagnetic signal. A measuring device measures a complex reflection coefficient as a function of frequency of the received electromagnetic field referenced to the antenna. The complex reflection coefficient is spatially and spectrally integrated. A processor executing an algorithm determines a quantitative metric from the measured complex reflection coefficient for comparison to another quantitative metric determined from one or more known electromagnetic signatures.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Other features will be in part apparent and in part pointed out hereinafter.

BRIEF DESCRIPTION OF THE DRAWINGS

Corresponding reference characters indicate corresponding parts throughout the drawings.

DETAILED DESCRIPTION

Electromagnetic (EM) signature evaluation techniques, using high frequency EM signals, enable determinations of authenticity and acceptability of devices under test, such as electronic integrated circuits (ICs), other passive and active electronic devices and components, and the like. Aspects of the present disclosure evaluate the intrinsic and unique characteristics of EM signatures of devices in a "powered-off" state. In one form, a device under test is illuminated/irradiated by an EM field for obtaining a characteristic EM signature of the device under test at a given frequency or band of frequencies.

Because of the differences and degrees of variability that may exist for particular devices under test (e.g., packaging material properties, electronic circuit design layout, etc.) the distinction between "acceptable" and "unacceptable" devices may not be robustly accomplished in a deterministic manner. Given the non-deterministic nature of these evaluations, statistical EM signature metrics, such as root-mean-square error (RMSE), enable a determination of acceptability of the device under test. For example, the characteristic EM signature of a device may be statistically compared to the EM signature of an "acceptable" group of the same device. In this manner, a metric related to the differences between the two classes of EM signatures may be established by which to determine and decide on the acceptability of a given device.

Figure 1:
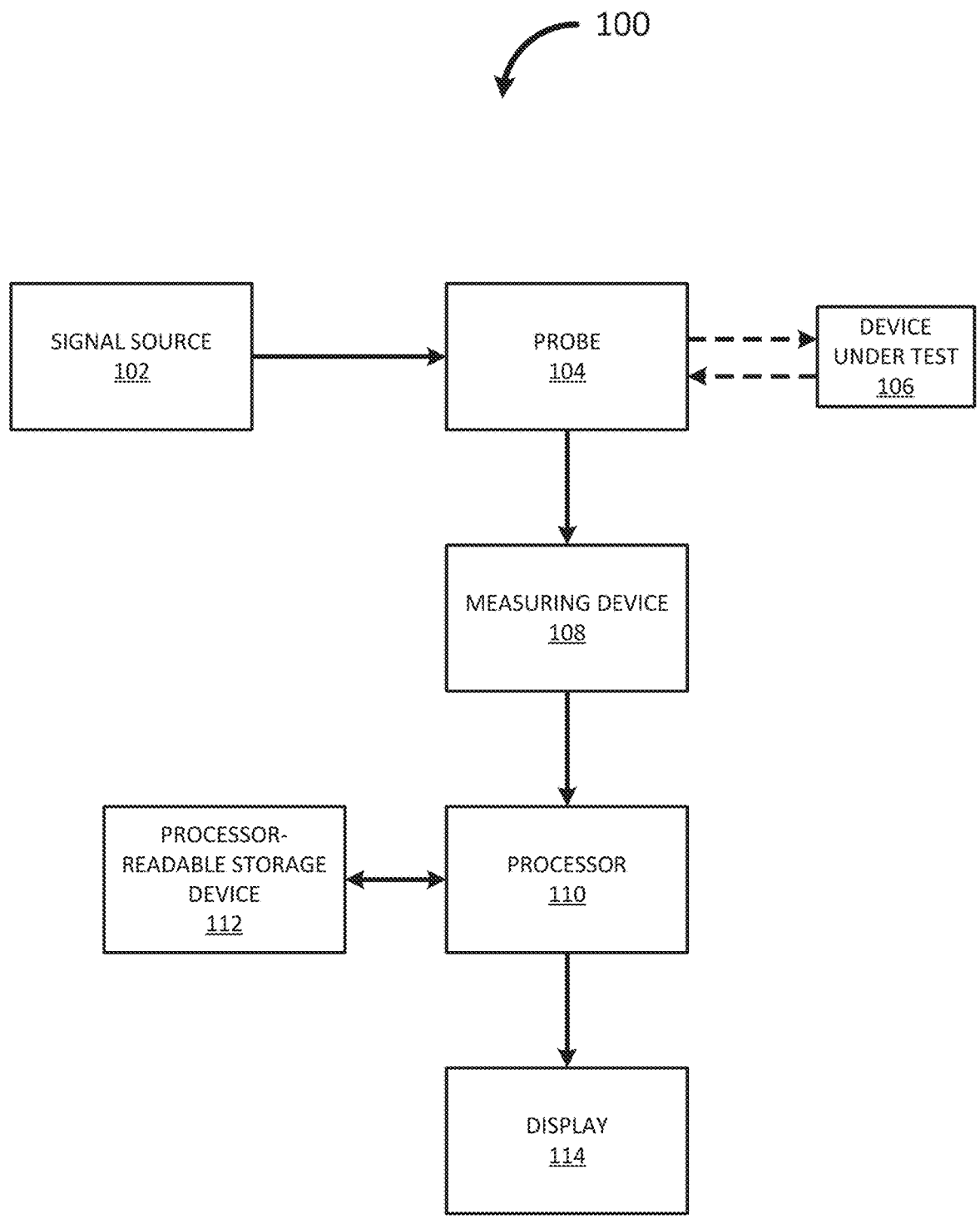
FIG. 1 is a block diagram of an exemplary reflectometry system according to an embodiment.

FIG. 1 illustrates an exemplary reflectometry system 100 according to an embodiment of the disclosure. The system 100 includes a signal source 102, a probe 104, a device under test (DUT) 106, a measuring device 108, a processor 110, a processor-readable storage device 112, and a display 114. The signal source 102 is electrically and/or communicatively connected to the probe 104. The probe 104 is also electrically and/or communicatively connected to the measuring device 108 (e.g., via a coax-to-waveguide adapter). The measuring device 108 is electrically and/or communicatively connected to the processor 110, which is in turn electrically and/or communicatively connected to the processor-readable storage device 112 and the display 114.

In an embodiment, signal source 102 is adapted to generate and provide a microwave signal to probe 104, which in turn is adapted to transmit microwave electromagnetic energy incident upon DUT 106. In this manner, signal source 102 and probe 104 are adapted irradiate/illuminate DUT 106 with electromagnetic energy. In one form, the term microwave as used herein comprises microwave or millimeter wave electromagnetic energy having a frequency greater than ultra-high frequency. For example, microwave electromagnetic energy includes electromagnetic energy having a frequency of about 300 megahertz (MHz) to about 300 gigahertz (GHz), such as the K-band (e.g., 18-26.5 GHz) and/or the Ka-band (e.g., 26.5-40 GHz). In an embodiment, the transmitted microwave signal is swept over a range of frequencies (e.g., a bandwidth greater than 0 Hz, a 25 GHz bandwidth, etc.).

The probe 104 is also adapted to receive (e.g., sample) an electromagnetic signal reflected from DUT 106 that includes the electromagnetic energy of the transmitted electromagnetic signal. The probe 104 may comprise an antenna (e.g., a horn antenna, etc.), an aperture probe, a waveguide having an aperture (e.g., an open-ended rectangular waveguide, etc.), an open-ended coaxial probe, and the like. In an embodiment, probe 104 is adapted to produce a spatially integrated reflected electromagnetic (EM) signature of DUT 106 by averaging the reflected signal over its aperture. Advantageously, the spatially integrated EM signature enables aspects of system 100 to provide precise results. In one form, probe 104 comprises a K-band waveguide having dimensions of 10.7×4.3 millimeters (0.420×0.170 inches). In another form, probe 104 comprises a Ka-band waveguide having dimensions of 7.11×3.56 millimeters (0.280×0.140 inches). One having ordinary skill in the art will understand that probes having varying EM characteristics and geometries, which offer measurement flexibility, are within the scope of the present disclosure. In an embodiment, probe 104 comprises a compact probe array, accommodating a plurality of testing spots simultaneously, which is made in the form of substrate-integrated-waveguides (SIW). In this embodiment, each SIW in the array is relatively small and its pertinent measurement electronic components can be manufactured using surface-mount and printed circuit board (PCB) technology, making the entire measurement system small and robust. In an embodiment, modified waveguide flanges are utilized with probe 104 to reduce unwanted reflections from the edges of the probing waveguide flanges, which enables a more robust reflection coefficient measurement.

The measuring device 108 is adapted to measure parameters (e.g., network parameters, scattering parameters, etc.) of the electrical network formed by signal source 102, probe 104, and DUT 106 (e.g., transmission and reflection of EM signals). In an embodiment, measuring device 108 measures both amplitude and phase properties. For example, measuring device 108 may comprise a vector network analyzer (VNA), a vector reflectometer, and/or a coherent reflectometer for measuring a complex reflection coefficient (e.g., amplitude and phase). An exemplary VNA includes an Anritsu 40 GHz VNA. In another embodiment, measuring device 108 measures amplitude properties only. For example, measuring device 108 may comprise a scalar network analyzer for measuring a real reflection coefficient (e.g., amplitude only). The measuring device 108 may also be referred to as a measuring instrument in accordance with one or more embodiments of the disclosure. In an embodiment, signal source 102, measuring device 108, processor 110, processor-readable storage device 112, and display 114 comprise a single measurement device/instrument, such as a VNA. Additionally or alternatively, probe 104 and measuring device 108 may comprise a single measurement device/instrument, in accordance with one or more embodiments of the disclosure.

The processor 110 is adapted to execute processor-executable instructions stored on processor-readable storage device 112 to obtain an electromagnetic signature of DUT 106. In an embodiment, processor 110 executes processor-executable instructions comprising an estimation algorithm for determining material characteristics of DUT 106 as a function of the reflected electromagnetic signal received by probe 104. In an embodiment in which DUT 106 is an integrated circuit (IC), the electromagnetic signature or the reflected electromagnetic signal containing properties (e.g., magnitude and/or phase) of the IC varies due to different material properties and/or varied electronic circuitry inside the IC. For example, the reflection from an IC may vary based on the internal IC package interconnect layout, bond wire routing within the IC, IC plastic casing material, presence and/or absence of the silicon die within the IC, and the like.

In an embodiment, processor 110 executes processor-executable instructions to develop and associate a quantitative metric with the differences between the spatially and spectrally integrated (e.g., over the waveguide band) reflection coefficient characteristics. Such a metric enables rapid evaluation and comparison of devices under test, such as in a large throughput manufacturing or testing environment, for example. In one form, processor 110 executes processor-executable instructions to calculate an $L^2$-norm. In an additional or alternative form, processor 110 executes processor-executable instructions to calculate a root-mean-square error (RMSE), which is defined as the average Euclidean distance between two reflection coefficient vectors and used as a quantitative metric to evaluate the integrated degree of difference between the reflection coefficients of one or more DUT 106. In an embodiment in which DUT 106 is an IC, RMSE is used as a quantitative metric to distinguish between "good" and "bad" ICs, new and aged ICs, and/or determine whether evaluated ICs are the same (e.g., same package) or different.

RMSE values, and similarly $L^2$-norm values, consider the spatial properties and reflection properties of DUT 106 over a wide range of measured frequencies. RMSE values also enable rapid and automated calculation of the differences between the reflection coefficients of an unknown/suspect DUT 106 and a genuine/reference counterpart of DUT 106. In an embodiment, processor 110 calculates RMSE values for measured wideband reflection coefficients for a DUT ($\Gamma(f)$) with respect to the average wideband reflection coefficient of a reference DUT ($\Gamma_{ref}(f)$) via the following equation in which f is the frequency and N represents the number of frequencies used (e.g., 401 frequency points) in the measurement and calculation:

$$RMSE = \sqrt{\frac{\sum_{f}^{N} |\Gamma(f) - \Gamma_{ref}(f)|^2}{N}}$$

The display 114 is adapted for displaying the electromagnetic signature of DUT 106 and/or the RMSE calculated by processor 110. For example, display 114 may comprise a graphical user interface of an oscilloscope, a workstation computing device, a tablet computing device, a smartphone, and the like. The RMSE values may be plotted on display 114 for a comparison between functionally different ICs and/or a comparison between functionally similar ICs having different specifications/parameters, as further described herein.

Figure 2:
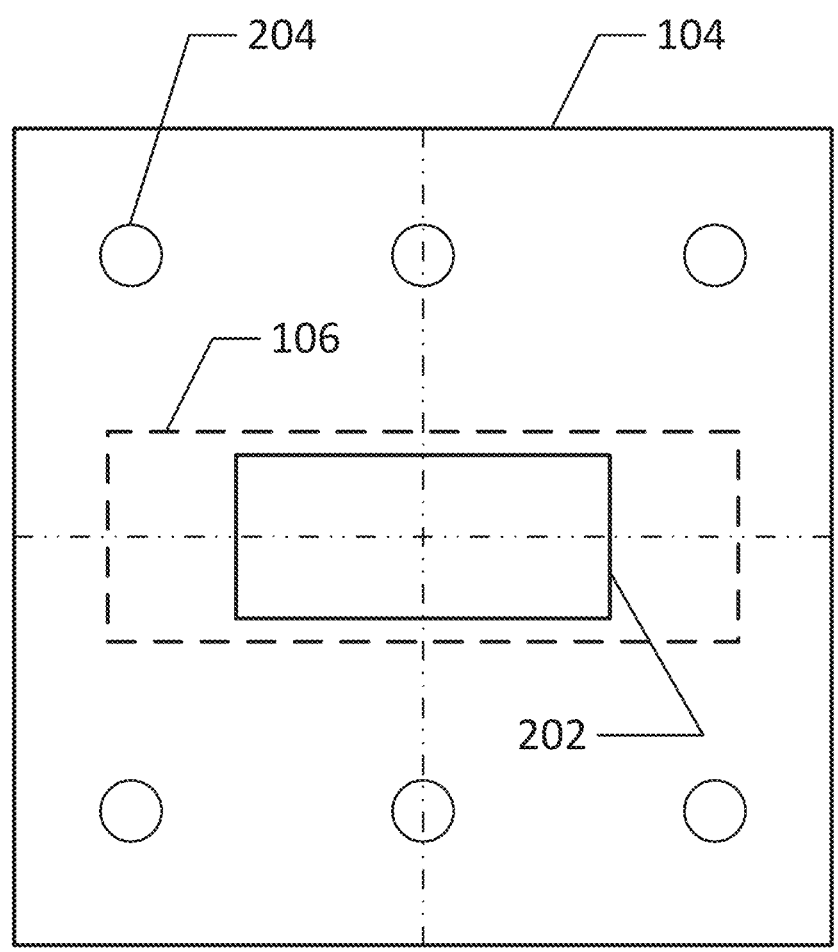
FIG. 2 illustrates an exemplary orientation and positioning of a device under test according to an embodiment.

FIG. 2 illustrates an exemplary orientation and positioning of DUT 106 in accordance with an embodiment of the disclosure. In the illustrated embodiment, probe 104 is a waveguide and includes an aperture 202. The DUT 106, shown as a dashed line, is oriented/positioned over the aperture 202. In the illustrated embodiment, a center point of aperture 202 (e.g., the intersection of the dot-dot-dash lines) is aligned with a center point of DUT 106. In an embodiment in which DUT 106 includes a 14-pin dual in-line package (DIP-14) having dimensions of 19×6.35 millimeters, aperture 202 comprises a K-band aperture having dimensions of 10.7×4.3 millimeters. In another embodiment in which DUT 106 includes a DIP-14 having dimensions of 19×6.35 millimeters, aperture 202 comprises a Ka-band aperture having dimensions of 7.11×3.56 millimeters.

A common alignment between successively measured devices under test enables their respective EM signatures to be more readily compared and provides a better indication of acceptability. In an embodiment, a test fixture (e.g., jig), as further described herein, is mounted on probe 104 via holes 204 and utilized to aid in obtaining a common alignment between successively measured devices under test, which results in repeatable measurements. For example, the test fixture may enable aligning successive devices under test within one micron accuracy. In another embodiment, multiple ICs may be arranged as an array and measured at one time.

In an embodiment, aperture 202 inherently averages the reflected signal over the aperture (e.g., testing spot) to produce a reflected EM signature of DUT 106 that is spatially integrated over the aperture area. The spatial integration helps reduce measurement variability among similar devices.

Aperture 202 may also have a substantially square shape or a substantially circular shape in accordance with one or more embodiments of the disclosure. In an embodiment, the shape of aperture 202 is matched to DUT 106. In these embodiments, EM signals having two different polarizations (e.g., orthogonal) are transmitted to and reflected by DUT 106. The EM signals may have slightly different frequencies or be excited at different times within the same measurement duration. In this manner, aspects of the present disclosure (e.g., processor 110 executing processor-executable instructions stored on processor-readable storage device 112) can calculate two simultaneous RMSE values, which enable detection of minor changes and changes within DUT 106 that are spatially near each other. Furthermore, the two different polarization signals may be combined to produce circular polarization data/information (e.g., right-hand and left-hand, clockwise and counterclockwise, etc.).

Figure 3:
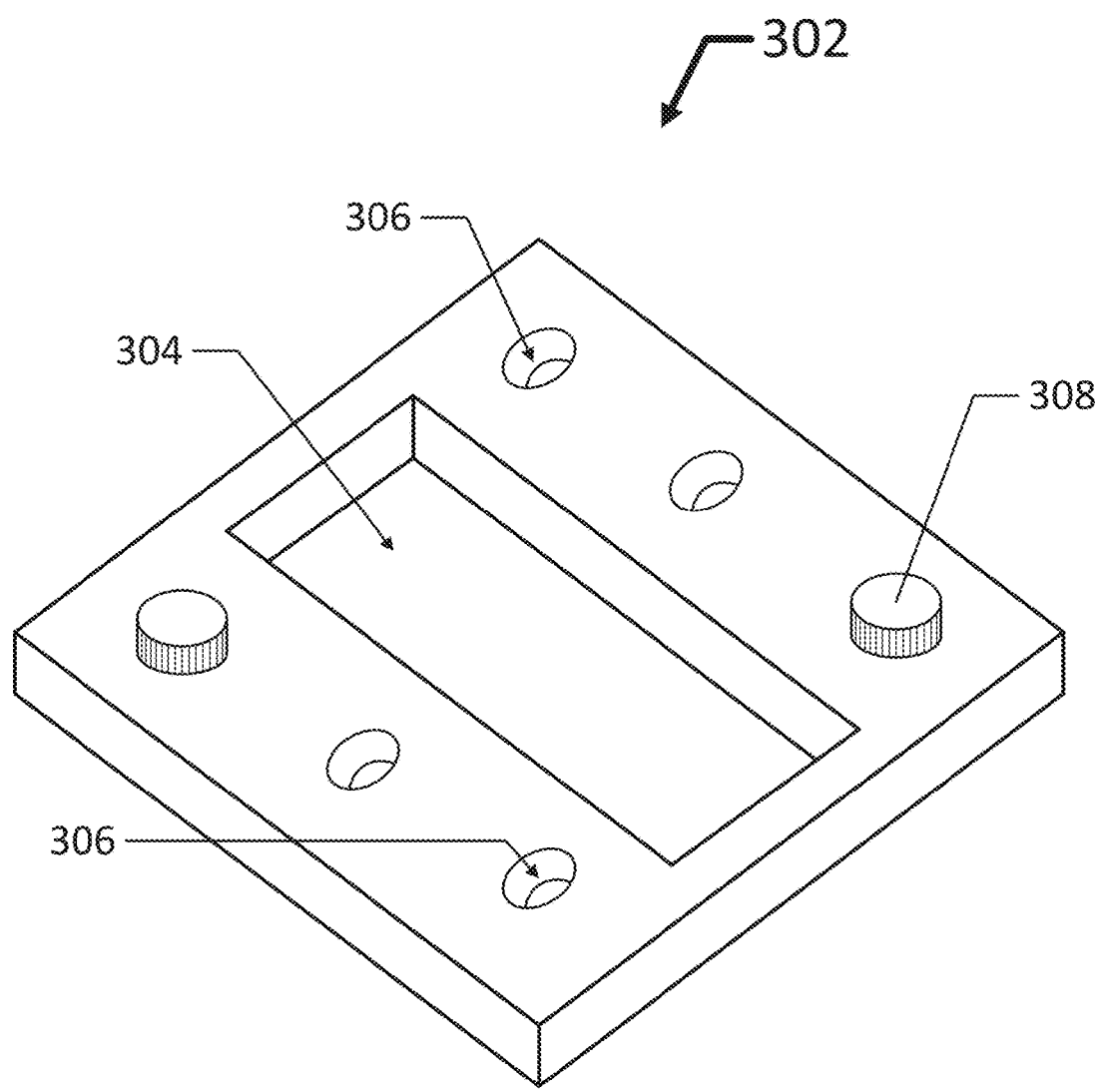
FIG. 3 illustrates an exemplary test fixture for orienting and positioning of an integrated circuit under test according to an embodiment.

FIG. 3 illustrates an exemplary test fixture 302 (e.g., a jig) that is configured to aid in obtaining a common alignment between successively measured devices under test in accordance with an embodiment of the disclosure. The test fixture 302 includes a DUT alignment opening 304 into which DUT 106 is inserted and fixture alignment openings 306 that align with holes 204 on probe 104. In an embodiment, test fixture 302 is secured to probe 104 via one or more fastening members 308 (e.g., thumbscrews, etc.) that each extend fully through a fixture alignment opening 306 and at least partially through a corresponding hole 204 on probe 104. The test fixture 302 may be comprised of rigid materials, such as metal, plastic, and the like. In an embodiment, test fixture 302 is custom designed for a particular combination of probe 104 and DUT 106 and produced by one or more additive manufacturing processes (e.g., 3-D printing, etc.) to facilitate accurate and repeatable positioning of DUT 106 over aperture 202.

Figure 4:
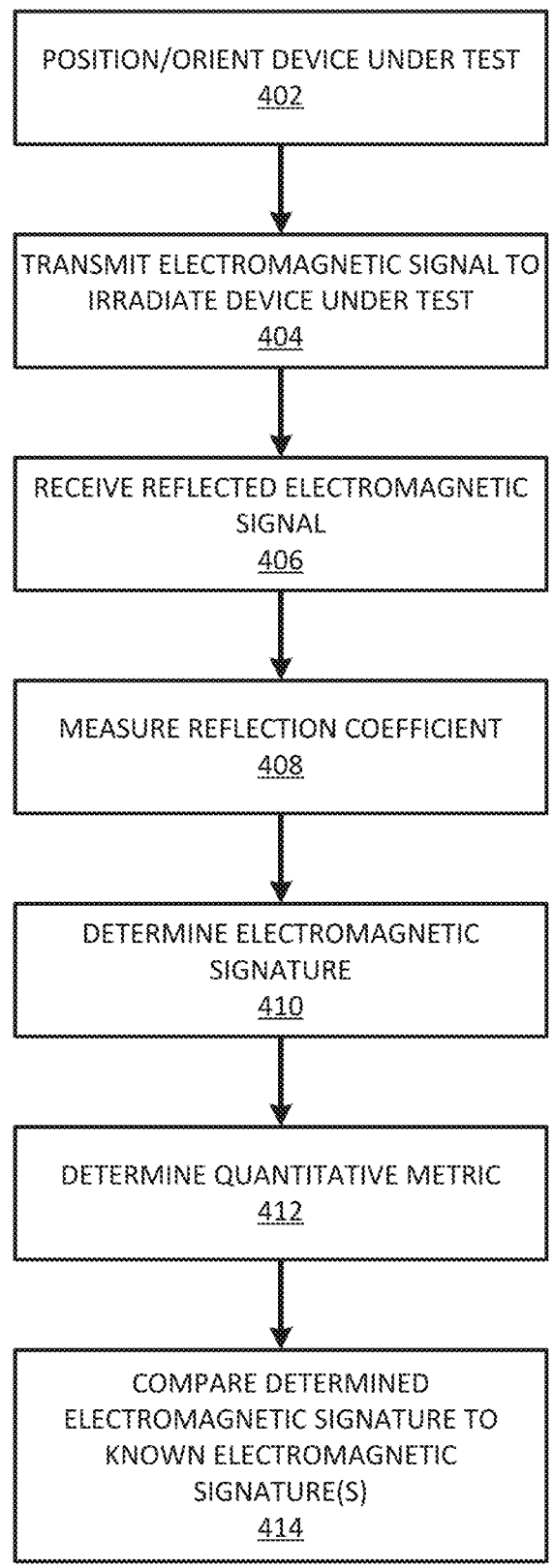
FIG. 4 is a flowchart of an exemplary operation of a reflectometry system according to an embodiment.

FIG. 4 illustrates an exemplary operation 400 of reflectometry system 100 in accordance with an embodiment of the disclosure. Compared to a properly manufactured IC (i.e., acceptable IC), an IC that has been tampered with, is cloned, is aged, and/or has been manufactured in a substandard manner (i.e., unacceptable IC) will have differences in materials properties (e.g., plastic or ceramic packaging dielectric properties), packaging damage (e.g., delamination due to aging), subversively modified electronic circuitry, and the like. When illuminated with a high-frequency EM signal, the properties (i.e., magnitude and/or phase) of the signal reflected from the unacceptable IC exhibit different characteristics than those of the signal reflected from the acceptable IC. Thus, illuminating an IC or any device under test with a high-frequency (e.g., microwave or millimeter wave) EM signal at one or more specific locations on the IC and obtaining the reflected signal referenced to the probe aperture (e.g., complex reflection coefficient) as a function of frequency enables generation of an EM signature intrinsic and unique to the IC/device under test.

With continued reference to FIG. 4, the DUT 106 is positioned/oriented 402 with respect to probe 104. As explained above, DUT 106 may have its center point aligned with a center point of probe 104 and/or aperture 302. After aligning DUT 106, signal source 102 generates and provides an EM signal to probe 104, which in turn transmits 404 the EM signal to irradiate DUT 106. In the millimeter wave frequency band and/or higher portions of the microwave frequency spectrum (e.g., greater than 30 GHz) and when employing a wideband antenna (e.g., an open-ended rectangular waveguide probe, an open-ended coaxial probe, a horn antenna, etc.), aspects of the disclosure may sweep the frequency over a large bandwidth while the antenna/probe aperture dimensions remain relatively small compared to the dimensions of DUT 106 (e.g., a common IC). For example, even at V-band with an operating frequency of about 50 to about 70 GHz, the waveguide aperture (e.g., aperture 302) may be about 3.8 mm by about 1.9 mm.

Referring further to FIG. 4, the probe 104 then receives 406 the electromagnetic signal reflected from DUT 106. The measuring device 108 measures 408 the reflection coefficient of the received reflected EM signal. As further described herein, measuring device 108 may measure a complex (e.g., magnitude and phase) reflection coefficient and/or a real (e.g., amplitude) reflection coefficient. In an embodiment, while sweeping over a bandwidth greater than 0 Hz (e.g., 25 GHz, etc.), slight internal variations in an IC (e.g., package delamination, altered circuitry, etc.) will be detected and exposed by aspects of the disclosure. The processor 110 executing processor-executable instructions stored on processor-readable storage device 112 then determines 410 an EM signature of DUT 106 that is unique and intrinsic to DUT 106. The processor 110 executing processor-executable instructions stored on processor-readable storage device 112 also determines 412 RMSE between the EM signature of DUT 106 and the EM signature of one or more known acceptable devices. The RMSE may then be used to compare 414 DUT 106 with the one or more known acceptable devices to determine acceptability of DUT 106. For example, the comparison may enable a determination of whether DUT 106 is counterfeit and/or aged.

In one form, aspects of the present disclosure enable inspecting DUT 106 (e.g., an IC) in fractions of a second using commercial vector network analyzers or custom-designed coherent reflectometers as measuring device 108. A single-spot and/or a multi-spot measurement approach may be utilized for larger ICs. In a multi-spot measurement approach, a plurality of specific spots on an IC can be measured with aspects of the present disclosure to obtain a more comprehensive EM signature of the IC.

In an aspect, a method of evaluating DUT 106 includes irradiating (404) DUT 106 with a first electromagnetic signal comprising electromagnetic energy having a microwave or higher frequency. The probe 104 receives (406) a second electromagnetic signal comprising the electromagnetic energy of the first electromagnetic signal reflected by DUT 106. The measuring device 108 measures (408) a reflection coefficient associated with DUT 106 as a function of frequency of the second electromagnetic signal. The method also includes processor 110 executing processor-executable instructions for determining (410) an electromagnetic signature of DUT 106 as a function of the reflection coefficient associated with DUT 106. The processor 110 also executes processor-executable instructions for comparing (414) the electromagnetic signature of DUT 106 to one or more known electromagnetic signatures to evaluate DUT 106.

In one form, DUT 106 comprises an integrated circuit. In another form, measuring device 108 comprises a scalar network analyzer that measures (408) a real reflection coefficient associated with DUT 106. In yet another form, the method includes measuring device 108 measuring a reflection coefficient associated with each of the one or more known good samples or exemplars and processor 110 executing processor-executable instructions for determining the one or more known electromagnetic signatures therefrom. In another form, the method includes aligning DUT 106 (e.g., via test fixture 302) with aperture 202 to receive the first electromagnetic signal. In yet another form, the evaluation of DUT 106 performed by processor 110 includes determining whether DUT 106 is aged compared to the known electromagnetic signature. In another form, the frequency of the electromagnetic energy of the first electromagnetic signal is about 18 GHz to about 26.5 GHz. In yet another form, the frequency of the electromagnetic energy of the first electromagnetic signal is about 26.5 GHz to about 40 GHz. In another form, the frequency of the electromagnetic energy of the first electromagnetic signal is at least about 30 GHz. In yet another form, the frequency of the electromagnetic energy of the first electromagnetic signal is about 50 GHz to about 70 GHz. In another form, irradiating (404) DUT 106 with the first electromagnetic signal comprises sweeping the first electromagnetic signal over a bandwidth greater than 0 Hz (e.g., 25 GHz, etc.). In yet another form, the method includes measuring device 108 repeating the measuring (408) for a plurality of spots on DUT 106 to obtain a comprehensive electromagnetic signature of DUT 106. In another form, DUT 106 comprises an array of integrated circuits. In yet another embodiment, the method includes rotating DUT 106 about 90 degrees and repeating the irradiating (404), the receiving (406), and the measuring (408).

In another aspect, a system for evaluating an electronic device includes an open-ended waveguide (104), a measuring instrument (108), and a processor (110). The open-ended waveguide is coupled to a signal source (102). The waveguide defines an aperture (202) through which an electromagnetic signal generated b the signal source is transmitted to an electronic device (106) located remotely from the aperture and through which an electromagnetic signal reflected from the electromagnetic device is received by the aperture. A magnitude and phase of the reflected electromagnetic signal exhibit different characteristics from a magnitude and a phase of the transmitted electromagnetic signal. The electronic device is aligned relative to the waveguide. The measuring instrument is coupled to the open-ended waveguide and configured to measure a complex reflection coefficient as a function of frequency of the reflected electromagnetic signal. The reflection coefficient has a magnitude and a phase. The processor is coupled to the measuring instrument and configured to execute processor-executable instructions for determining an electromagnetic signature of the electronic device as a function of the measured complex reflection coefficient relative to one or more known electromagnetic signatures.

In yet another aspect, a method for non-destructive detection of counterfeit electronic devices includes transmitting (404), by an antenna (104), an electromagnetic signal. The electromagnetic signal comprises at least high-frequency electromagnetic energy incident upon an electronic device (106) aligned relative to the antenna. The antenna receives (406) an electromagnetic field reflected from the electronic device that has a magnitude and a phase that differ from a magnitude and a phase of the transmitted electromagnetic signal. A measuring device (108) measures (408) a complex reflection coefficient as a function of frequency of the received electromagnetic field referenced to the antenna. The measured complex reflection coefficients are spatially and spectrally integrated. A processor (110) executing an algorithm determines (412) a quantitative metric from the measured complex reflection coefficient for comparison to another quantitative metric determined from one or more known electromagnetic signatures.

In another aspect, a method of evaluating a plurality of ICs includes irradiating (404) the plurality of ICs (106) with a first electromagnetic signal comprising electromagnetic energy having a microwave or higher frequency. The method also includes receiving (406) a plurality of electromagnetic signals each comprising the electromagnetic energy of the first electromagnetic signal reflected by a corresponding one of the plurality of ICs. A measuring device (108) measures (408) a reflection coefficient associated with each of the plurality of ICs as a function of frequency of the electromagnetic signal reflected by the ICs. And the method includes determining (410) an electromagnetic signature of each of the plurality of ICs as a function of the reflection coefficient associated therewith. Variability in the electromagnetic signatures of the plurality of ICs indicates the plurality of ICs includes at least one counterfeit IC.

EXAMPLES

Figure 5B:
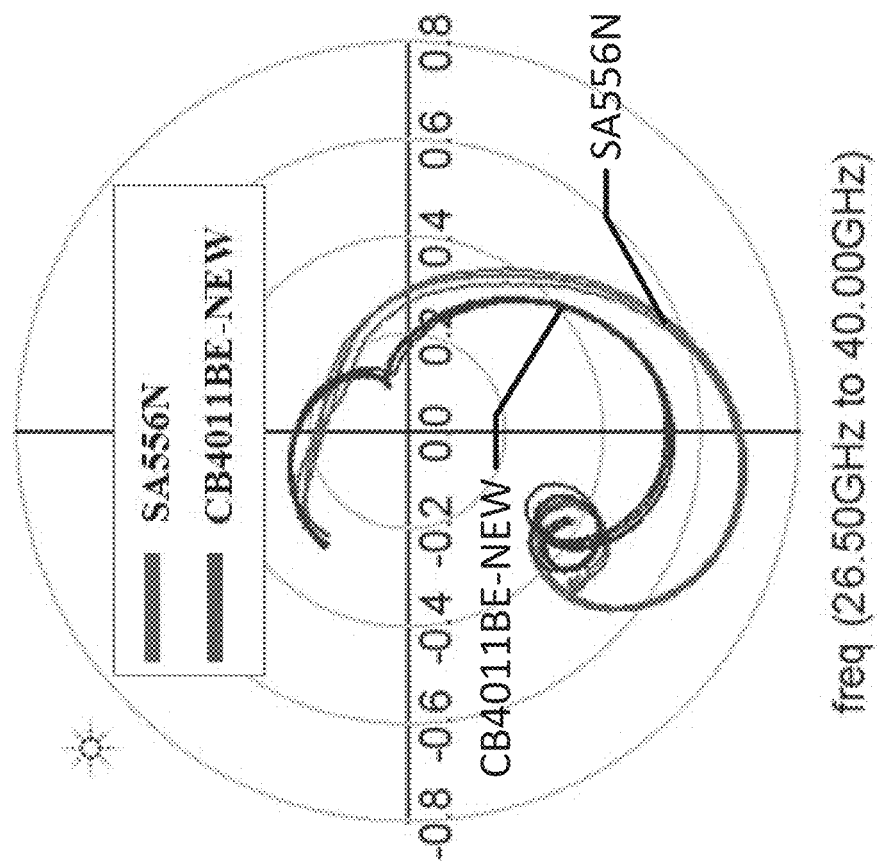
FIGS. 5A and 5B illustrate exemplary complex reflection coefficients, as a function of frequency, between an integrated circuit under test and a reference integrated circuit according to an embodiment.
Figure 5A:
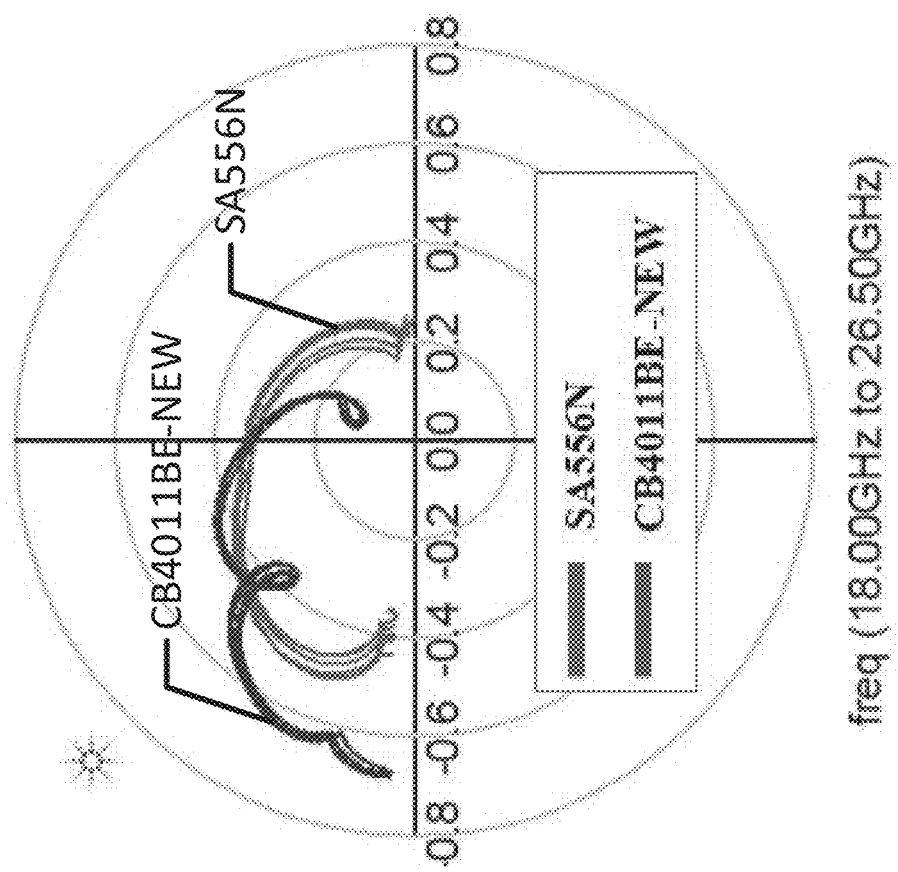

To demonstrate the potential of aspects of the present disclosure, two functionally different ICs were tested using system 100. FIGS. 5A and 5B illustrate exemplary complex reflection coefficients (e.g., $S_{11}$) plotted using Agilent ADS on a complex plane plot for five measurements of the two ICs as measured by system 100 over the K-band and Ka-band frequency ranges, respectively. The illustrated complex reflection coefficients show excellent measurement repeatability for a particular IC over the five measurements. Additionally, comparison of FIGS. 5A and 5B illustrates that the measured complex reflection coefficient of the same IC is significantly different between the two frequency bands (K-band and Ka-band) and their corresponding aperture dimensions.

Referring further to FIGS. 5A and 5B, these figures illustrate the comparison of measurement results between two functionally different ICs, namely: a dual precision timer (SA556N) and a quad NAND gate (CD4011BE), both having the same package (DIP-14). Five test samples of each IC were measured at the K-band (18-26.5 GHz) and Ka-band (26.5-40 GHz) to check for differences in their wideband reflection coefficients among different samples/units of the same IC. These measurements were carried out to obtain a realistic understanding of any differences that might exist among the same samples/units of ICs as a result of manufacturing process and the measurement approach. This information is utilized for setting a measurement baseline by which slightly dissimilar ICs (e.g., counterfeits, etc.) are detected. The results show that the variations for different samples/units of the same IC are insignificant as compared with differences between functionally different ICs. Furthermore, the reflection coefficients of these ICs are significantly different as a function of frequency in both bands. The reflection coefficients for the SA556N and CD4011BE ICs shown in FIGS. 5A and 5B intersect (i.e., are the same) at certain frequencies in both the K-band and Ka-band. Consequently, single-frequency measurements at those specific frequencies would not have resulted in the ICs being classified as different. The wideband measurements obtained in accordance with an aspect of the disclosure are much more comprehensive and yield robust differentiation between the two ICs. The measurement results illustrated in FIGS. 5A and 5B provide an example of how systems and methods in accordance with the disclosure (e.g., system 100, operation 400, etc.) differentiate between two or more ICs having the same packaging with different internal physical characteristics, which enables rapid measurement and comparison of a suspect or counterfeit IC with a reference IC.

To verify the effectiveness of techniques described herein, a number of commercially available ICs were obtained, as listed in Table 1. Given the fact that no counterfeit IC was available for these measurements, and to demonstrate the efficacy of the proposed method for detecting counterfeit ICs, several ICs were chosen having slight performance characteristic differences, but with essentially the same functionalities. Also, all ICs had the same packaging specification (DIP-14) such that the external dimensions of all tested ICs were identical and visually indistinguishable.

TABLE 1

| Part Number | Type/Function | Manufacturer | Difference between ICs | | Samples |
|---|---|---|---|---|---|
| CD4011BE | NAND Gate | Hyundai | New | New Vs Aged | 4 |
| CD4011BE | NAND Gate | Hyundai | Aged | | 7 |
| SA556N | Timer/Oscillator | Texas Instruments | −40-85° C. | Temperature | 5 |
| NE556N | Timer/Oscillator | Texas Instruments | 0-70° C. | range | 5 |
| PIC16F505 | Microcontroller | Microchip | | Different Parts | 5 |
| PIC16F506 | Microcontroller | Microchip | | | 5 |
| SN74HC4066N | Analog switch | Texas Instruments | 2-6 V | Supply Voltage | 5 |
| SN74AHC4066N | Analog switch | Texas Instruments | 2-5.5 V | range | 5 |
| LM324AN | Op-Amp | Fairchild Semiconductor | | Different Parts | 5 |
| LM324N | Op-Amp | Fairchild Semiconductor | | and Different | 5 |
| LM324AN | Op-Amp | Texas Instruments | | Manufacturers | 5 |
| LM324N | Op-Amp | Texas Instruments | | | 5 |
| LM224AN | Op-Amp | Texas Instruments | | Different Parts | 5 |
| LM224N | Op-Amp | Texas Instruments | | | 5 |
| SN75189N | Receiver | Texas Instruments | | Different Parts | |
| SN75189AN | Receiver | Texas Instruments | | | |

TABLE 1-continued

| Part Number | Type/Function | Manufacturer | Difference between ICs | | Samples |
|---|---|---|---|---|---|
| SN74HC86N | X-OR | Texas Instruments | 2-6 V | Supply Voltage | 5 |
| SN74AHCT86N | X-OR | Texas Instruments | 4.5-5.5 V | range | 5 |
| LM723CN | Linear Regulator | STMicro-electronics | | Different | 5 |
| UA723CN | Linear Regulator | Texas Instruments | | Manufacturers | 5 |
| TL497ACN | DC-DC Boost converter | Texas Instruments | 0-70° C. | Operating | 5 |
| TL497AIN | DC-DC Boost converter | Texas Instruments | −40-85° C. | Temperature range | 5 |
| MCP4902 | DAC | Microchip | | | 5 |

The tested ICs were selected such that they could be categorized into three groups to demonstrate the effectiveness of the techniques described herein for testing multiple features/parameters that constitute different types of ICs. The objective was to test the techniques for distinguishing between the following groups.

Group A: ICs that are functionally different (e.g., having different part numbers).

Group B: ICs that are functionally similar but having slight differences in specifications, such as military and industrial grades, different manufacturers, different supply voltage requirements, and the like.

Group C: New and aged sets of identical ICs. ICs in Group C were tested for basic logic and current draw and were all deemed operational.

Figure 6A:
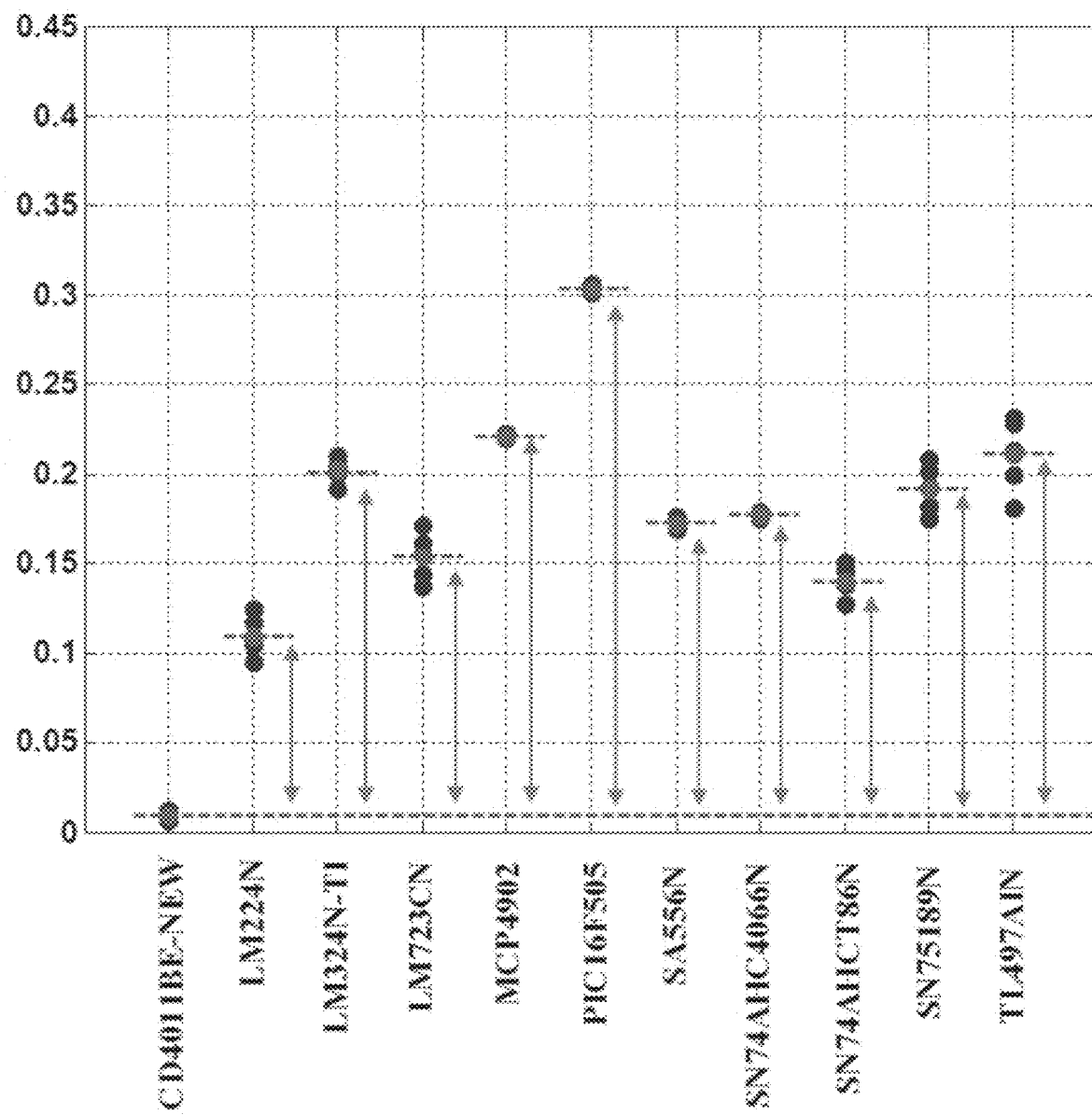
FIGS. 6A and 6B illustrate exemplary root-mean-square error values between integrated circuits under test referenced to a mean value of root-mean-square error values of a reference integrated circuit according to an embodiment.
Figure 6B:
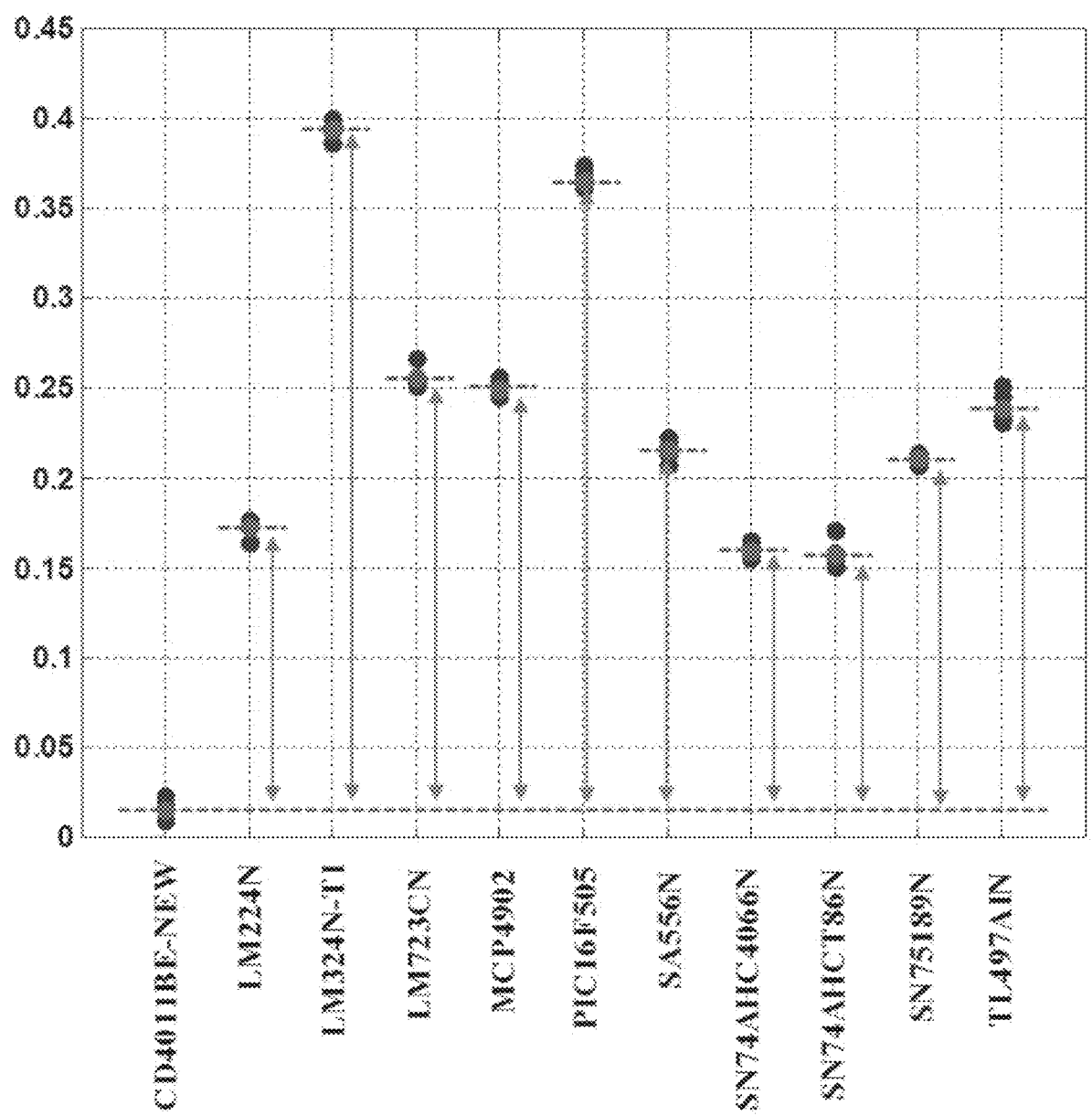

The approach described herein was used to calculate RMSE values for the ICs listed in Table 1, between the CD4011BE-New IC (as the reference IC) and all other functionally different ICs (Group A). For comparison, RMSE values are plotted in FIGS. 6A and 6B for the K-band (18-26.5 GHz) and Ka-band (26.5-40 GHz), respectively. For each waveguide band in this investigation, 401 frequency points were measured. CD4011BE-New was arbitrarily chosen as the reference IC for this comparison in order to illustrate relative numbers associated with RMSE values. The circles with dashed horizontal lines through them indicate the average value of each given set of measurements for the specific IC indicated. In addition, FIGS. 6A and 6B are drawn with the same scale to facilitate an easier comparison of RMSE values for each frequency band. To have a better understanding of the differences in the reflection coefficient RMSE values, X-ray images of all the ICs were also obtained. To allow for comparison between the X-ray images and identification of differences between the internal structures, all the IC samples were oriented in the same way—with the notch on the right-hand side of the images.

The results indicate some important facts. First, the five independent RMSE measurements associated with each individual IC is tightly grouped indicating the high degree of measurement repeatability and robustness associated with the technique described herein. Second, the relative difference between the RMSE for each IC and the reference IC is substantial, indicating the relative ease by which ICs may be individually differentiated. Third, the results of the reflected EM signatures are consistent with expectations, as RMSE values are larger when there is a larger physical difference in the interconnect layout as corroborated by the X-ray images.

For comparing the differences between functionally similar ICs having slightly different specifications, such as military and industrial grades, different manufacturers, different supply voltage requirements, and the like (Group B) and comparing between "new (good)" versus "aged (old)" (Group C), a similar measurement and RMSE value calculation procedure was followed, as further described herein. One of the ICs from each pair was used as the reference for RMSE value calculations of a slightly dissimilar IC. In such cases, differences in RMSE values indicate slight differences in the ICs that may or may not be visually obvious or detectable by conventional inspection methods. The RMSE value comparisons and the X-ray images of the ICs for exemplary ICs in Group B and Group C at the K-band (18-26.5 GHz) and Ka-band (26.5-40 GHz) are illustrated in FIGS. 7A-9D. The actual functionality differences in the IC parameters can be obtained by referring to Table 1. Typically, there may be one or more IC parameters that are different between a given IC pairs being compared, and the combined effects of such differences result in different RMSE values that enable differentiation between the two ICs. The mean values of RMSE values are indicated in FIGS. 7C, 7D, 8C, 8D, 9C, and 9D.

Figure 7A:
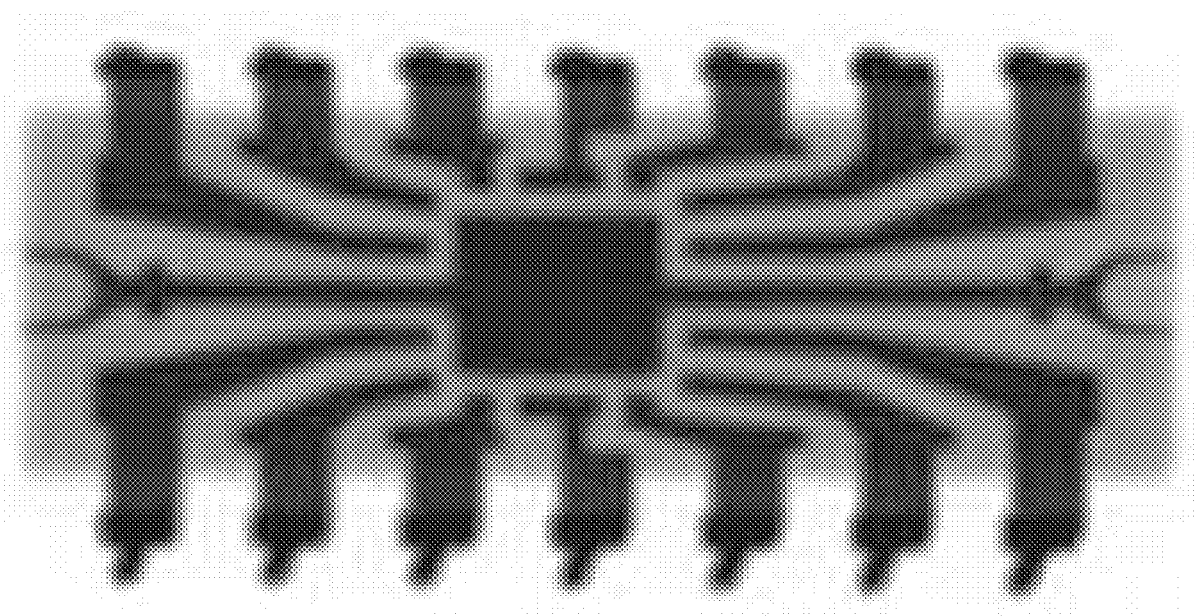
FIGS. 7A and 7B are X-ray images illustrating an internal structure of exemplary DC-DC Boost converter integrated circuits.
Figure 7B:
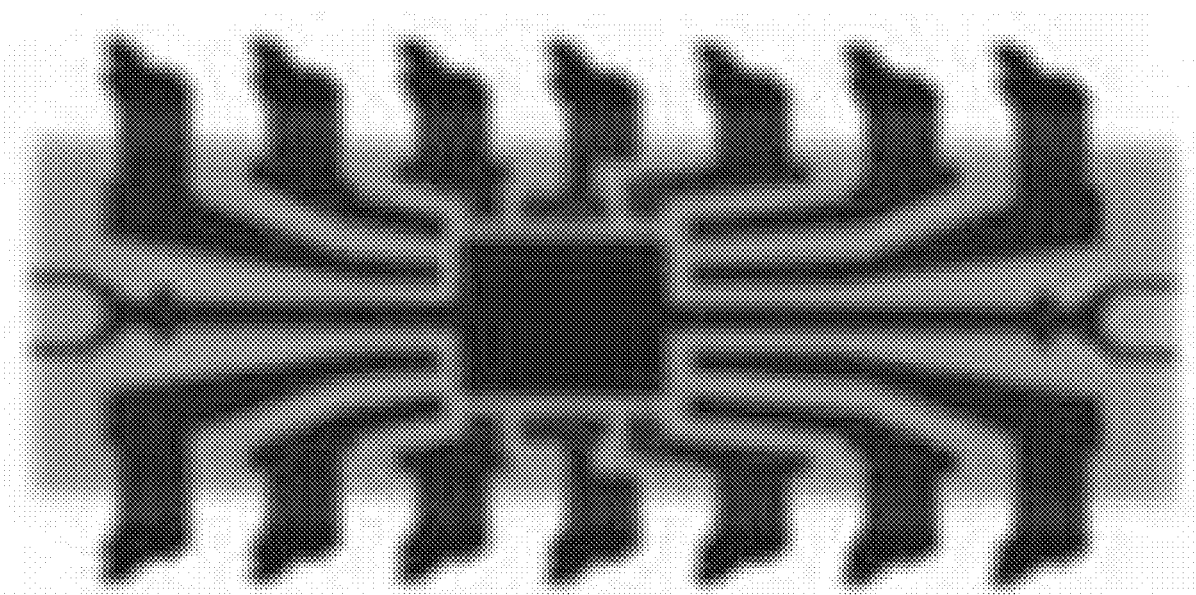
Figure 7C:
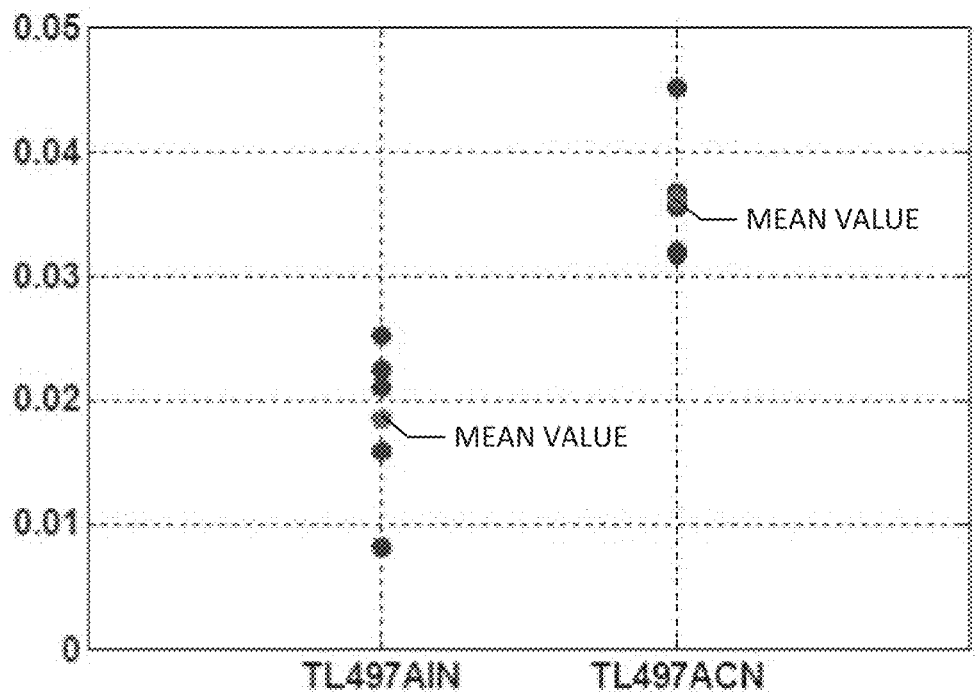
FIGS. 7C and 7D illustrate exemplary root-mean-square error values of the integrated circuits of FIGS. 7A and 7B.
Figure 7D:
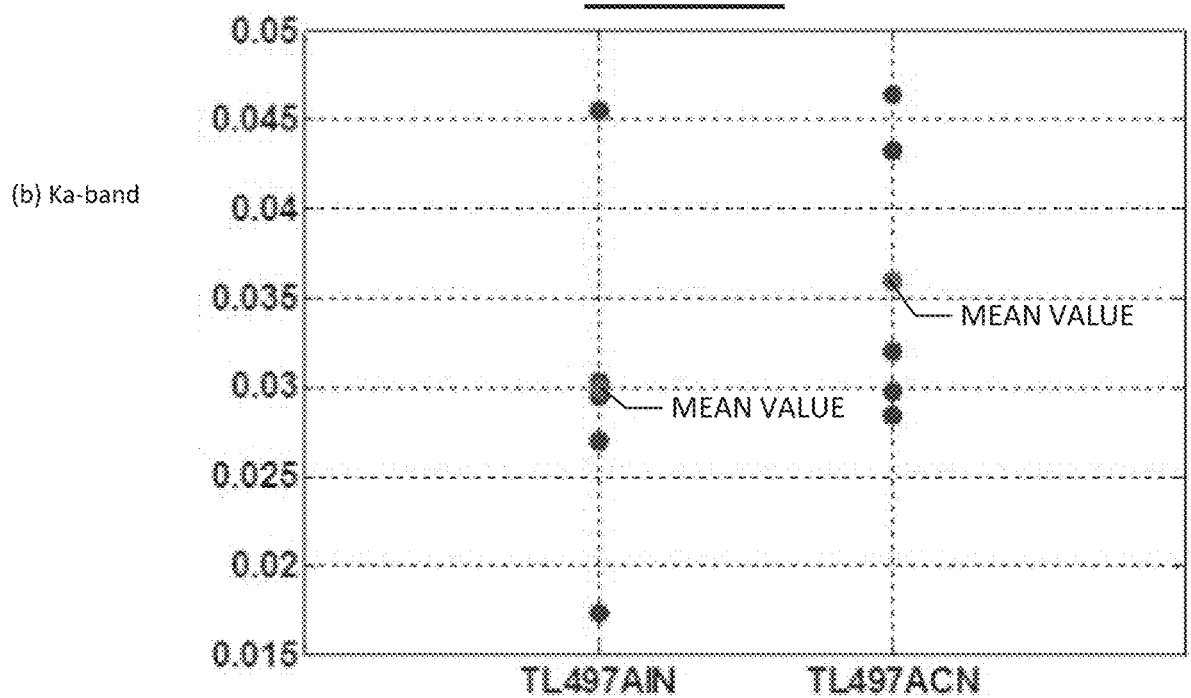

FIGS. 7A and 7B are X-ray images of two dc-to-dc boost converter ICs (TL497AIN and TL497ACN, respectively) with identical specifications except for different operating free-air temperature ranges (e.g., Group B). The X-ray images are nearly identical for the two ICs. However, RMSE values, as illustrated in FIGS. 7C and 7D, for the two ICs are measurably different even though the internal interconnect layouts are nearly identical. FIG. 7C illustrates RMSE values of the TL497AIN and TL497ACN ICs measured at the K-band (18-26.5 GHz) and FIG. 7D illustrates RMSE values of the TL497AIN and TL497ACN ICs measured at the Ka-band (26.5-40 GHz). The differences in RMSE values most likely result from differences in the plastic package materials used, as further explained herein.

Figure 8A:
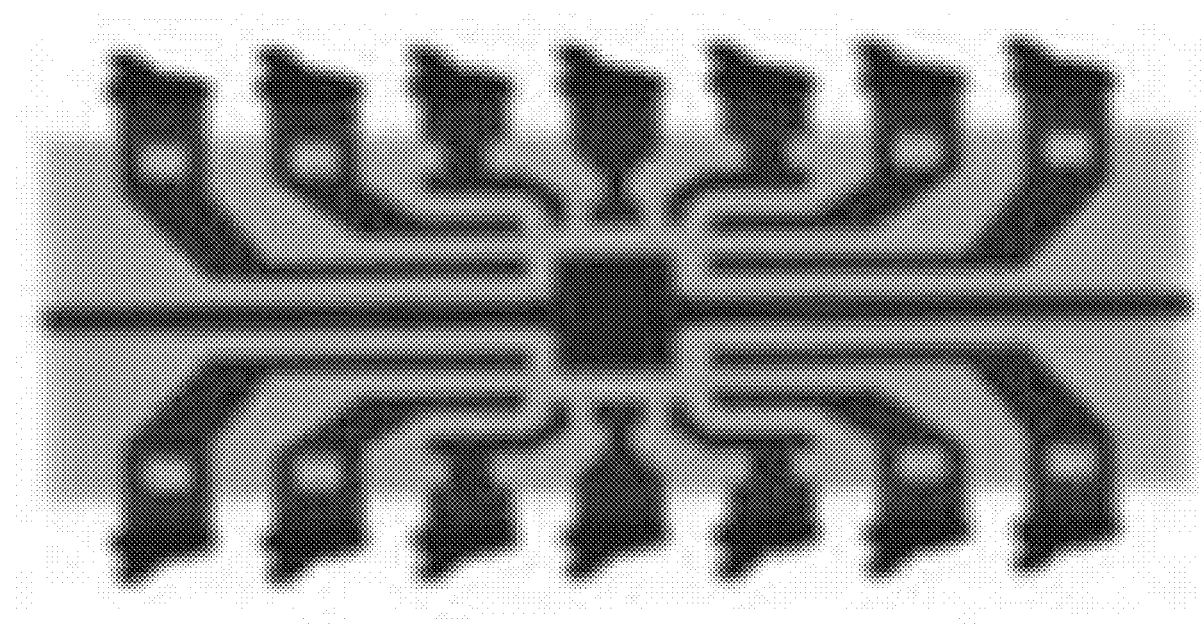
FIGS. 8A and 8B are X-ray images illustrating an internal structure of exemplary linear regulator integrated circuits.
Figure 8B:
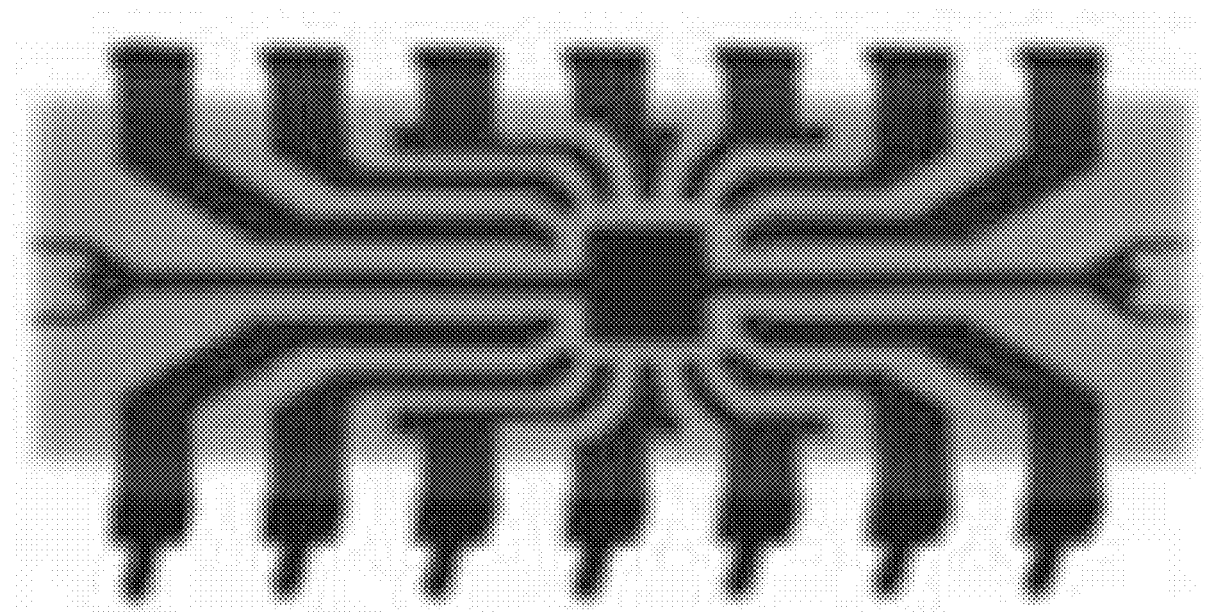
Figure 8C:
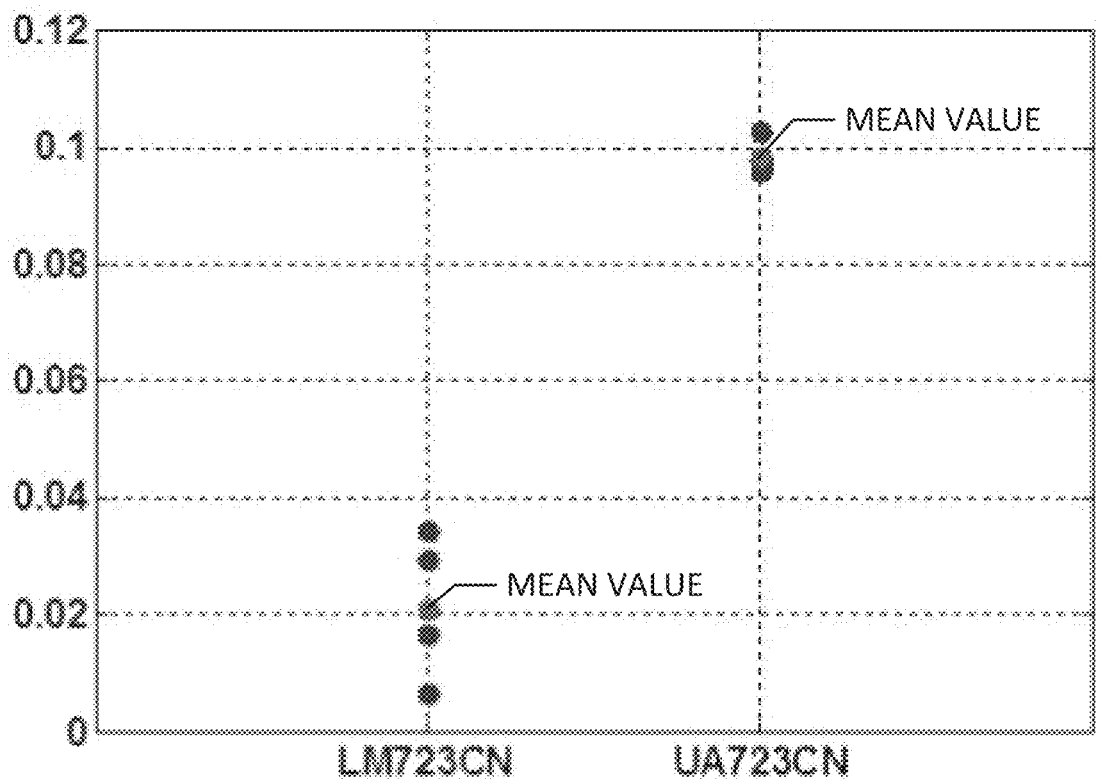
FIGS. 8C and 8D illustrate exemplary root-mean-square error values of the integrated circuits of FIGS. 8A and 8B.
Figure 8D:
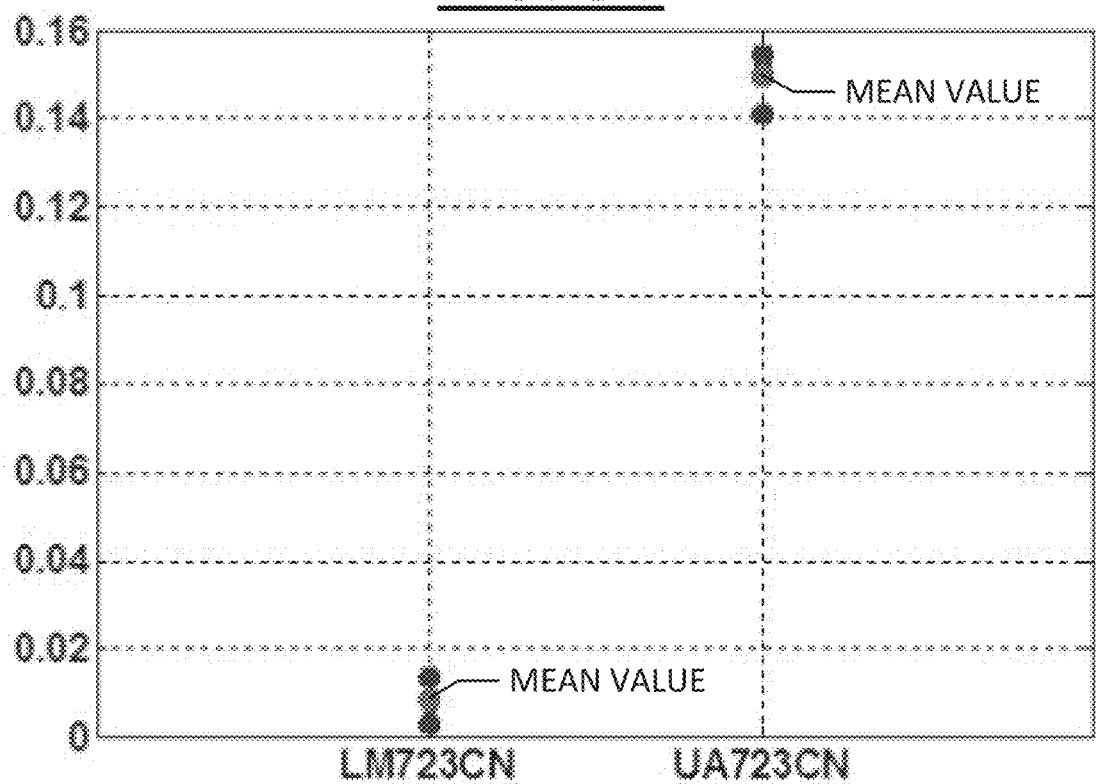

FIGS. 8A and 8B are X-ray images to two linear regulators (LM723CN and UA723CN, respectively) having identical specifications from two different manufacturers (e.g., Group B). FIG. 8C illustrates RMSE values of the LM723CN and UA723CN ICs measured at the K-band (18-26.5 GHz) and FIG. 8D illustrates RMSE values of the LM723CN and UA723CN ICs measured at the Ka-band (26.5-40 GHz). The X-ray images show that the internal interconnect layout is quite different and may also have slight differences in the electronic circuits in the IC die/chip resulting in differences in RMSE values.

Figure 9A:
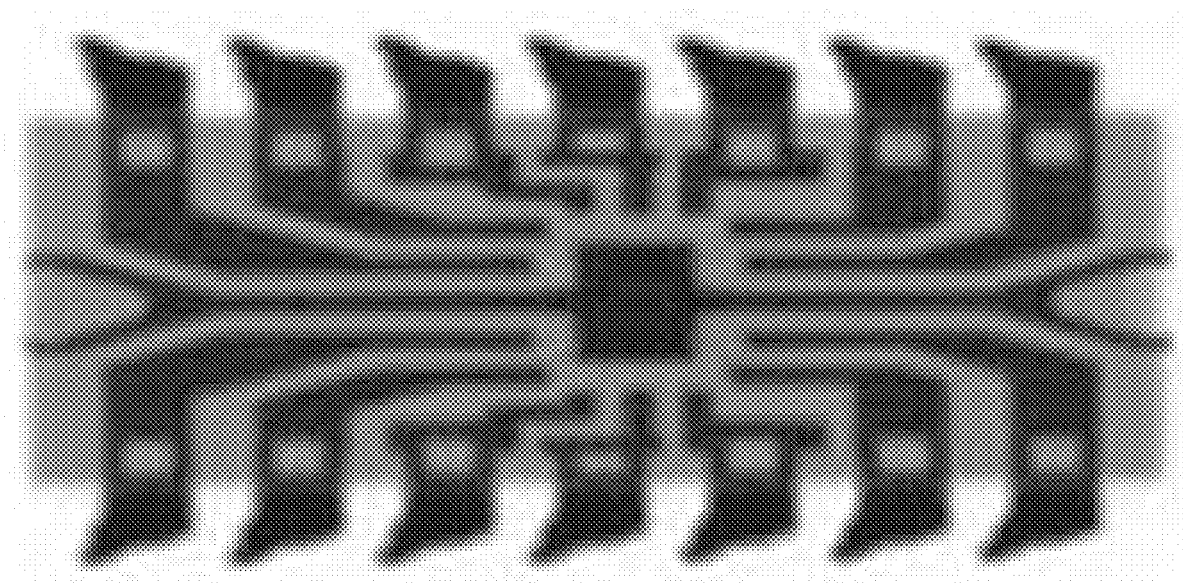
FIGS. 9A and 9B are X-ray images illustrating an internal structure of exemplary new and aged NAND gate integrated circuits.
Figure 9B:
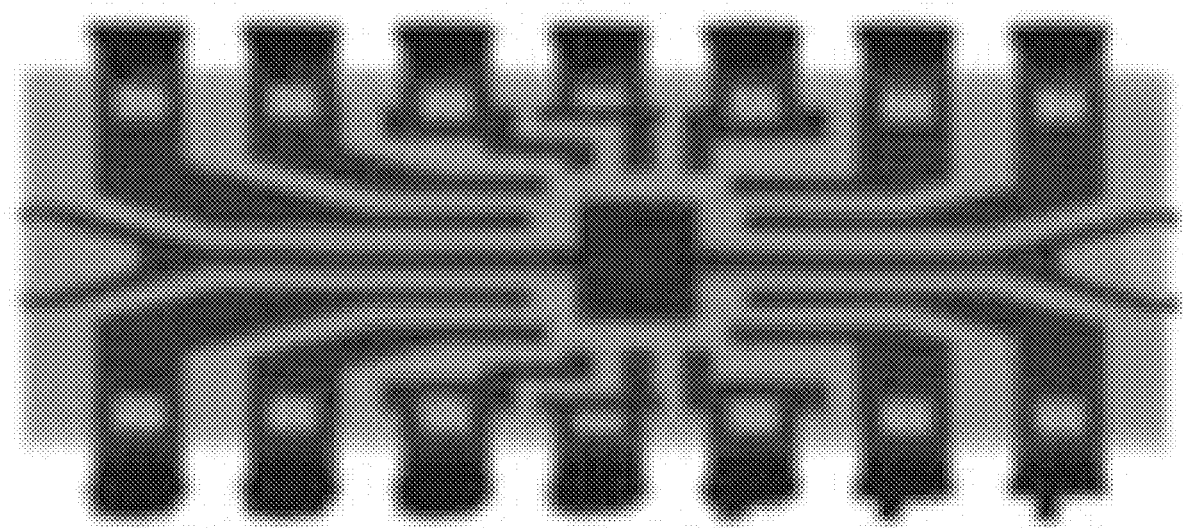
Figure 9C:
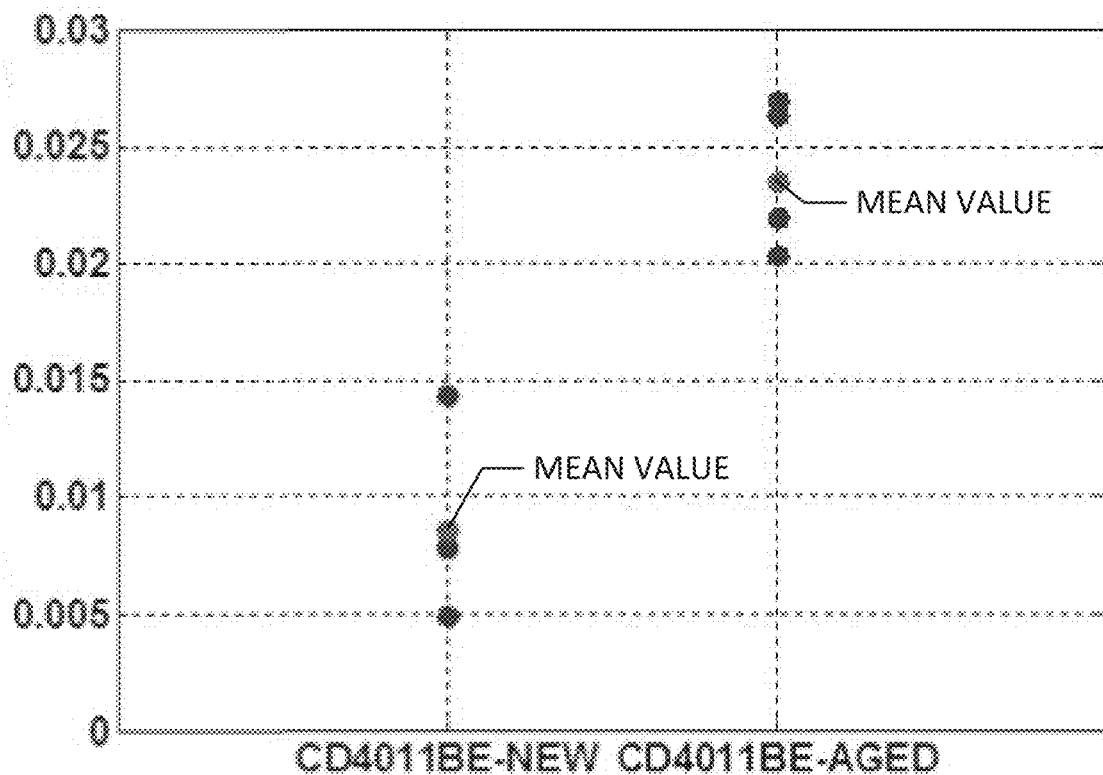
FIGS. 9C and 9D illustrate exemplary root-mean-square error values of the integrated circuits of FIGS. 9A and 9B.
Figure 9D:
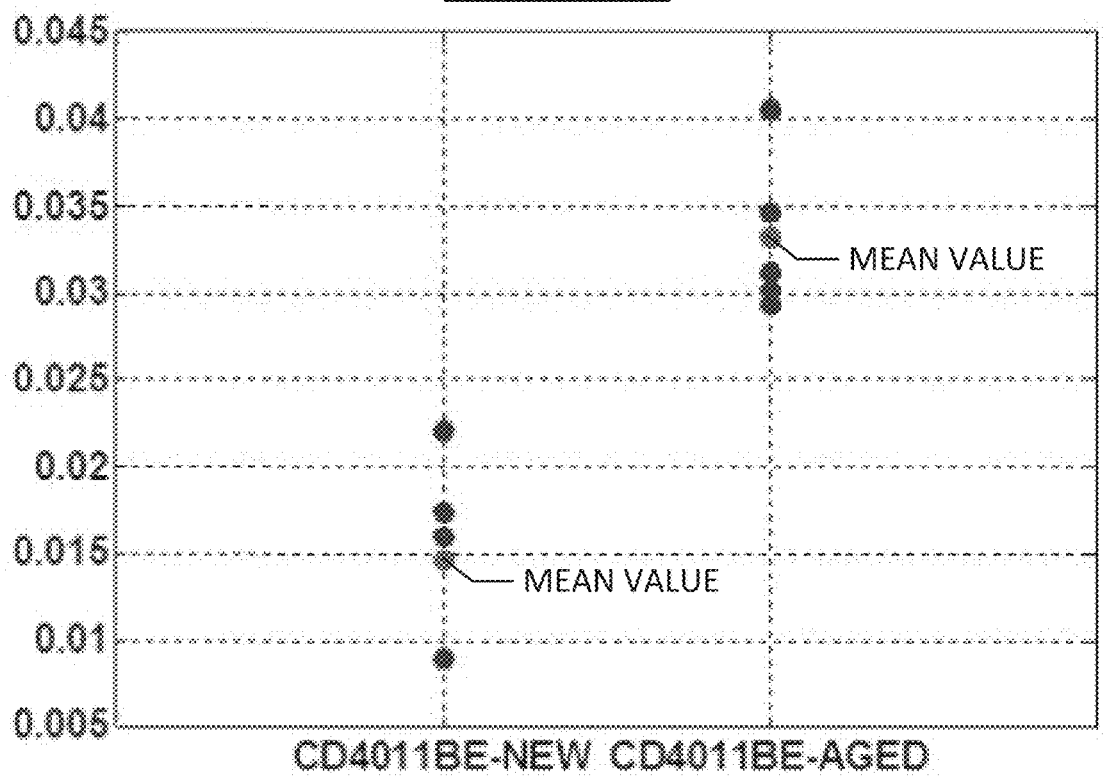

FIG. 9A is an X-ray image of a NAND gate IC in a "new" condition (CD4011BE-New) and FIG. 9B is an X-ray image of the exact same NAND gate IC in an "old/aged" condition (CD4011BE-Aged) (e.g., Group C). FIG. 8C illustrates RMSE values of the CD4011BE-New and CD4011BE-Aged ICs measured at the K-band (18-26.5 GHz) and FIG. 8D illustrates RMSE values of the CD4011BE-New and CD4011BE-Aged ICs measured at the Ka-band (26.5-40 GHz). As expected, the X-ray images show no differences between the two ICs because they are electronically identical. Nevertheless, differences in the RMSE values are apparent between the two ICs, which are attributed to the changes in the plastic package material caused by the aging process, as microwave and millimeter wave signals interact with different materials differently and can distinguish materials changes. These results show the effectiveness of the techniques described herein over X-ray imaging to detect changes in the package materials caused by aging. Another important observation is that the variation between RMSE values is larger for the five samples of the "old or aged" ICs, as compared with the different samples of the "new" ICs. This is attributed to the likely changes in the plastic package materials of the "old/aged" ICs, as compared with the more consistent material properties of the "new" ICs. Therefore, in addition to comparing RMSE values between the "new" and "old/aged," the variation of the RMSE values among identical ICs may be used as a metric to distinguish between "new" and "old/aged" ICs in accordance with an aspect of the disclosure.

The comparison of RMSE values and X-ray images shown in FIGS. 7A-9D demonstrates the effectiveness of the techniques described herein for differentiating between ICs having one or more slight dissimilarities in the forms of, for example: internal interconnect layout, die size, missing bond wires, on-die electronic circuitry, and plastic package material characteristics. Furthermore, the results indicate that the RMSE values are larger when there are larger physical differences in the interconnect layout as corroborated by the X-ray images. The data presented here also demonstrate the ability of the techniques described herein for detecting a wide range of counterfeit (e.g., intentionally tampered with, illegally manufactured, etc.) and aged ICs.

Although embodiments of the present disclosure were described herein in which DUT 106 is an integrated circuit, one having ordinary skill in the art will understand that DUT 106 may be other electrical components and devices, objects and materials that change properties over time (e.g., concrete), objects and materials subject to counterfeiting, and the like.

Embodiments of the present disclosure may comprise a special purpose computer including a variety of computer hardware, as described in greater detail below.

Embodiments within the scope of the present disclosure also include computer-readable media for carrying or having computer-executable instructions or data structures stored thereon. Such computer-readable media can be any available media that can be accessed by a special purpose computer. By way of example, and not limitation, such computer-readable media can comprise RAM, ROM, EEPROM, CD-ROM or other optical disk storage, magnetic disk storage, or other magnetic storage devices, or any other medium that can be used to carry or store desired program code means in the form of computer-executable instructions or data structures and that can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

The following discussion is intended to provide a brief, general description of a suitable computing environment in which aspects of the disclosure may be implemented. Although not required, aspects of the disclosure will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represent examples of corresponding acts for implementing the functions described in such steps.

Those skilled in the art will appreciate that aspects of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Aspects of the disclosure may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing aspects of the disclosure includes a special purpose computing device in the form of a conventional computer, including a processing unit, a system memory, and a system bus that couples various system components including the system memory to the processing unit. The system bus may be any of several types of bus structures including a memory bus or memory controller, a peripheral bus, and a local bus using any of a variety of bus architectures. The system memory includes read only memory (ROM) and random access memory (RAM). A basic input/output system (BIOS), containing the basic routines that help transfer information between elements within the computer, such as during start-up, may be stored in ROM. Further, the computer may include any device (e.g., computer, laptop, tablet, PDA, cell phone, mobile phone, a smart television, and the like) that is capable of receiving or transmitting an IP address wirelessly to or from the internet.

The computer may also include a magnetic hard disk drive for reading from and writing to a magnetic hard disk, a magnetic disk drive for reading from or writing to a removable magnetic disk, and an optical disk drive for reading from or writing to removable optical disk such as a CD-ROM or other optical media. The magnetic hard disk drive, magnetic disk drive, and optical disk drive are connected to the system bus by a hard disk drive interface, a magnetic disk drive-interface, and an optical drive interface, respectively. The drives and their associated computer-readable media provide nonvolatile storage of computer-executable instructions, data structures, program modules, and other data for the computer. Although the exemplary environment described herein employs a magnetic hard disk, a removable magnetic disk, and a removable optical disk, other types of computer readable media for storing data can be used, including magnetic cassettes, flash memory cards, digital video disks, Bernoulli cartridges, RAMs, ROMs, solid state drives (SSDs), and the like.

The computer typically includes a variety of computer readable media. Computer readable media can be any available media that can be accessed by the computer and includes both volatile and nonvolatile media, removable and non-removable media. By way of example, and not limitation, computer readable media may comprise computer storage media and communication media. Computer storage media include both volatile and nonvolatile, removable and non-removable media implemented in any method or technology for storage of information such as computer readable instructions, data structures, program modules or other data. Computer storage media are non-transitory and include, but are not limited to, RAM, ROM, EEPROM, flash memory or other memory technology, CD-ROM, digital versatile disks (DVD) or other optical disk storage, SSDs, magnetic cassettes, magnetic tape, magnetic disk storage or other magnetic storage devices, or any other medium which can be used to store the desired non-transitory information, which can accessed by the computer. Alternatively, communication media typically embody computer readable instructions, data structures, program modules or other data in a modulated data signal such as a carrier wave or other transport mechanism and includes any information delivery media.

Program code means comprising one or more program modules may be stored on the hard disk, magnetic disk, optical disk, ROM, and/or RAM, including an operating system, one or more application programs, other program modules, and program data. A user may enter commands and information into the computer through a keyboard, pointing device, or other input device, such as a microphone, joy stick, game pad, satellite dish, scanner, or the like. These and other input devices are often connected to the processing unit through a serial port interface coupled to the system bus. Alternatively, the input devices may be connected by other interfaces, such as a parallel port, a game port, or a universal serial bus (USB). A monitor or another display device is also connected to the system bus via an interface, such as video adapter 48. In addition to the monitor, personal computers typically include other peripheral output devices (not shown), such as speakers and printers.

One or more aspects of the disclosure may be embodied in computer-executable instructions (i.e., software), routines, or functions stored in system memory or nonvolatile memory as application programs, program modules, and/or program data. The software may alternatively be stored remotely, such as on a remote computer with remote application programs. Generally, program modules include routines, programs, objects, components, data structures, etc. that perform particular tasks or implement particular abstract data types when executed by a processor in a computer or other device. The computer executable instructions may be stored on one or more tangible, non-transitory computer readable media (e.g., hard disk, optical disk, removable storage media, solid state memory, RAM, etc.) and executed by one or more processors or other devices. As will be appreciated by one of skill in the art, the functionality of the program modules may be combined or distributed as desired in various embodiments. In addition, the functionality may be embodied in whole or in part in firmware or hardware equivalents such as integrated circuits, application specific integrated circuits, field programmable gate arrays (FPGA), and the like.

The computer may operate in a networked environment using logical connections to one or more remote computers. The remote computers may each be another personal computer, a tablet, a PDA, a server, a router, a network PC, a peer device, or other common network node, and typically include many or all of the elements described above relative to the computer. The logical connections include a local area network (LAN) and a wide area network (WAN) that are presented here by way of example and not limitation. Such networking environments are commonplace in office-wide or enterprise-wide computer networks, intranets and the Internet.

When used in a LAN networking environment, the computer is connected to the local network through a network interface or adapter. When used in a WAN networking environment, the computer may include a modem, a wireless link, or other means for establishing communications over the wide area network, such as the Internet. The modem, which may be internal or external, is connected to the system bus via the serial port interface. In a networked environment, program modules depicted relative to the computer, or portions thereof, may be stored in the remote memory storage device. It will be appreciated that the network connections shown are exemplary and other means of establishing communications over wide area network may be used.

Preferably, computer-executable instructions are stored in a memory, such as the hard disk drive, and executed by the computer. Advantageously, the computer processor has the capability to perform all operations (e.g., execute computer-executable instructions) in real-time.

The order of execution or performance of the operations in embodiments illustrated and described herein is not essential, unless otherwise specified. That is, the operations may be performed in any order, unless otherwise specified, and embodiments may include additional or fewer operations than those disclosed herein. For example, it is contemplated that executing or performing a particular operation before, contemporaneously with, or after another operation is within the scope of aspects of the disclosure.

Embodiments may be implemented with computer-executable instructions. The computer-executable instructions may be organized into one or more computer-executable components or modules. Aspects of the disclosure may be implemented with any number and organization of such components or modules. For example, aspects of the disclosure are not limited to the specific computer-executable instructions or the specific components or modules illustrated in the figures and described herein. Other embodiments may include different computer-executable instructions or components having more or less functionality than illustrated and described herein.

When introducing elements of aspects of the disclosure or the embodiments thereof, the articles "a", "an", "the" and "said" are intended to mean that there are one or more of the elements. The terms "comprising", "including", and "having" are intended to be inclusive and mean that there may be additional elements other than the listed elements.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:
1. A method of evaluating a device under test (DUT) comprising:
   irradiating a DUT with a first electromagnetic signal comprising electromagnetic energy having a microwave or higher frequency;

receiving a second electromagnetic signal comprising the electromagnetic energy of the first electromagnetic signal reflected by the DUT;

measuring, by a measuring device, a reflection coefficient associated with the DUT as a function of frequency of the second electromagnetic signal;

determining an electromagnetic signature of the DUT as a function of the reflection coefficient associated therewith; and comparing the electromagnetic signature of the DUT to one or more known electromagnetic signatures to evaluate the DUT.

2. The method of claim 1, wherein the one or more known electromagnetic signatures are determined from one or more known good samples, and wherein determining the electromagnetic signature of the DUT comprises determining a root-mean-square error of the reflection coefficient associated with the DUT relative to the reflection coefficient associated with each of the one or more known good samples.

3. The method of claim 1, further comprising aligning the DUT to have a common alignment and a common orientation with at least one other DUT previously evaluated.

4. The method of claim 1, wherein evaluation of the DUT comprises determining whether the DUT is counterfeit compared to the known electromagnetic signature.

5. The method of claim 1, wherein the DUT comprises an integrated circuit (IC), and wherein the reflection coefficient associated with the integrated circuit varies based on at least one of an internal IC package interconnect layout, bond wire routing within the IC, an IC plastic casing material, a presence of a silicon die within the IC, and an absence of the silicon die within the IC.

6. A system for evaluating an electronic device comprising:

a probe having a signal source coupled thereto, said probe including a radiating aperture through which an electromagnetic signal generated by the signal source is transmitted to an electronic device located remotely from the aperture and through which an electromagnetic signal reflected from the electronic device is received by the aperture, wherein a magnitude and a phase of the reflected electromagnetic signal exhibit different characteristics from a magnitude and a phase of the transmitted electromagnetic signal, and wherein the electronic device is aligned relative to the waveguide;

a measuring instrument coupled to the probe and configured to measure a complex reflection coefficient as a function of frequency of the reflected electromagnetic signal, the reflection coefficient having a magnitude and a phase; and a processor configured to determine an electromagnetic signature of the electronic device as a function of the measured complex reflection coefficient relative to one or more known electromagnetic signatures.

7. The system of claim 6, wherein the probe is an open-ended rectangular waveguide.

8. The system of claim 7, wherein a shape of the radiating aperture is matched to the electronic device.

9. The system of claim 6, wherein the probe is an open-ended coaxial probe.

10. The system of claim 6, wherein the measuring instrument comprises at least one of a vector network analyzer, a vector reflectometer, a coherent reflectometer, and a scalar network analyzer.

11. The system of claim 6, further comprising a test fixture configured to align the electronic device before transmitting the electromagnetic signal.

12. The system of claim 6, wherein the processor is further configured to determine a root-mean-square error (RMSE) between the measured complex reflection coefficient and the one or more known electromagnetic signatures, the RMSE indicative of a dissimilarity between the electronic device and the one or more known electromagnetic signatures.

13. The system of claim 6, wherein the processor is further configured to determine whether the electronic device is dissimilar to the one or more known electromagnetic signatures.

14. The system of claim 6, wherein the measuring instrument is configured to measure the complex reflection coefficient as a function of frequency of the reflected electromagnetic signal for a plurality of spots on the electronic device to obtain a comprehensive electromagnetic signature of the electronic device.

15. A method for non-destructive detection of counterfeit electronic devices comprising:

transmitting, by an antenna, an electromagnetic signal, said electromagnetic signal comprising at least high-frequency electromagnetic energy incident upon an electronic device aligned relative to the antenna;

receiving, by the antenna, an electromagnetic field reflected from the electronic device, wherein the reflected electromagnetic field has a magnitude and a phase that differ from a magnitude and a phase of the transmitted electromagnetic signal;

measuring, by a measuring device, a complex reflection coefficient as a function of frequency of the received electromagnetic field referenced to the antenna, wherein the complex reflection coefficient is spatially and spectrally integrated; and determining, by a processor executing an algorithm, a quantitative metric from the measured complex reflection coefficient for comparison to another quantitative metric determined from one or more known electromagnetic signatures.

16. The method of claim 15, the one or more known electromagnetic signatures are determined from one or more known good samples of the electronic device, and wherein the quantitative metric comprises a root-mean-square error.

17. The method of claim 15, wherein the electronic device is aligned relative to the antenna by a test fixture mounted to the antenna.

18. The method of claim 15, further comprising determining, by the processor executing an algorithm, whether the electronic device is dissimilar to the one or more known electromagnetic signatures.

19. The method of claim 15, further comprising sweeping the transmitted electromagnetic signal over a bandwidth greater than 0 Hz.

20. The method of claim 15, wherein the antenna is at least one of an open-ended waveguide and a horn antenna matched to a shape of the electronic device.

* * * * *